(12) United States Patent
Taherzadeh Boroujeni et al.

(10) Patent No.: US 10,700,803 B2
(45) Date of Patent: Jun. 30, 2020

(54) SYSTEM AND METHOD FOR GENERATING CODEBOOKS WITH SMALL PROJECTIONS PER COMPLEX DIMENSION AND UTILIZATION THEREOF

(71) Applicant: Huawei Technologies Co., Ltd., Shenzhen (CN)

(72) Inventors: Mahmoud Taherzadeh Boroujeni, Ottawa (CA); Alireza Bayesteh, Ottawa (CA); Hosein Nikopour, Ottawa (CA); Mohammadhadi Baligh, Ottawa (CA)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/825,886

(22) Filed: Aug. 13, 2015

(65) Prior Publication Data

US 2016/0049999 A1  Feb. 18, 2016

Related U.S. Application Data

(60) Provisional application No. 62/038,044, filed on Aug. 15, 2014.

(51) Int. Cl.
| | |
|---|---|
| *H04J 13/16* | (2011.01) |
| *H04L 27/34* | (2006.01) |
| *H04L 27/32* | (2006.01) |
| *H04L 27/26* | (2006.01) |

(Continued)

(52) U.S. Cl.
CPC .............. *H04J 13/16* (2013.01); *H03M 13/25* (2013.01); *H04J 13/10* (2013.01); *H04L 1/0058* (2013.01);

(Continued)

(58) Field of Classification Search
CPC ...... H04B 7/0456; H04B 7/0482; H04B 7/04; H04J 13/16

See application file for complete search history.

(56) References Cited

U.S. PATENT DOCUMENTS

| | | | |
|---|---|---|---|
| 2002/0051501 A1* | 5/2002 | Demjanenko | ......... H04L 1/0013 375/298 |
| 2003/0039321 A1 | 2/2003 | Lee et al. | |

(Continued)

FOREIGN PATENT DOCUMENTS

| | | |
|---|---|---|
| CN | 101414898 A | 4/2009 |
| JP | 2013207377 A | 10/2013 |

(Continued)

OTHER PUBLICATIONS

Gottfried Ungerboeck, Channel Coding with Multilevel/Phase Signals, IEEE Transactions on Information Theory, vol. IT-28, No. 1, Jan. 1982. pp. 55-67.*

(Continued)

*Primary Examiner* — Jeffrey M Rutkowski
*Assistant Examiner* — Chae S Lee
(74) *Attorney, Agent, or Firm* — Slater Matsil, LLP (57) ABSTRACT

A method for data transmission by a device in a communication system includes modulating a first data stream using a codebook to produce a second data stream, wherein the codebook is in correspondence with a multi-dimensional modulation map that includes a number of distinct projections per complex dimension that is smaller than a number of modulation points of the multi-dimensional modulation map, and transmitting the second data stream over allocated resources in the communication system.

23 Claims, 8 Drawing Sheets

(51) Int. Cl.
*H03M 13/25* (2006.01)
*H04J 13/10* (2011.01)
*H04L 5/00* (2006.01)
*H04L 1/00* (2006.01)

(52) U.S. Cl.
CPC ........ *H04L 5/0021* (2013.01); *H04L 27/2634* (2013.01); *H04L 27/32* (2013.01); *H04L 27/3411* (2013.01); *H04L 27/3416* (2013.01); *H04L 1/004* (2013.01)

(56) References Cited

U.S. PATENT DOCUMENTS

| | | | | |
|---|---|---|---|---|
| 2005/0141644 | A1* | 6/2005 | Sadowsky | H04L 25/03216 375/324 |
| 2010/0046658 | A1* | 2/2010 | Yosoku | H04B 7/0689 375/267 |
| 2013/0230119 | A1* | 9/2013 | Dhakal | H04B 7/0456 375/295 |
| 2013/0251058 | A1* | 9/2013 | Wu | H04B 7/0456 375/267 |
| 2014/0140360 | A1 | 5/2014 | Nikopour et al. | |
| 2016/0315679 | A1* | 10/2016 | Murakami | H04L 5/00 |

FOREIGN PATENT DOCUMENTS

| | | |
|---|---|---|
| KR | 20130037429 A | 4/2013 |
| WO | 2014075637 A1 | 5/2014 |
| WO | 2014090189 A1 | 6/2014 |

OTHER PUBLICATIONS

Gottfried Ungerboeck (Channel Coding with Multilevel/Phase Signals, IEEE Transactions on Information Theory, vol. IT-28, No. 1, Jan. 1982).*

Forney, Jr., D. G., "Coset Codes—Part II: Binary Lattices and Related Codes," IEEE Transactions on Information Theory, vol. 34, No. 5, Sep. 1988, pp. 1152-1187.

Forney, Jr., D. G., "Coset Codes—Part I: Inroduction and Geometrical Classification," IEEE Transaction on Information Theory, vol. 34, No. 5, Sep. 1988, pp. 1123-1151.

International Search Report of Patent Cooperation Treaty (PCT), International Application No. PCT/CN2015/086977, Applicant Huawei Technologies Co., Ltd., dated Nov. 20, 2015, 11 pages.

Taherzadeh Mahmoud et al: "SCMA Codebook Design", 2014 IEEE Both Hicular Technology Conference (VTC2014—Fall), IEEE, Sep. 14, 2014 (Sep. 14, 2014), pp. 1-5, JXP032694934, DOI: 10.1109/VTCFALL.2014.6966170 [retrieved on Nov. 24, 2014].

Hosein, Nikopour et al: "Sparse Code Multiple Access", 2013 IEEE 24th International Symposium on Personal, Indoor and Mobile Radio Communications: Fundamentals and PHY Track, Sep. 8, 2013 (Sep. 8, 2013), XP055227113, Retrieved from the Internet: URL:http://ieeexplore.ieee.org/ielx7/6656121/6666091/06666156. pdf?tp=&arnumber=6666156&isnumber=6666091 [retrieved on Nov. 10, 2015].

* cited by examiner

SYSTEM AND METHOD FOR GENERATING CODEBOOKS WITH SMALL PROJECTIONS PER COMPLEX DIMENSION AND UTILIZATION THEREOF

This application claims the benefit of U.S. Provisional Application No. 62/038,044, filed on Aug. 15, 2014, entitled "System and Method for Sparse Code Multiple Access Codebooks with Small Projections per Complex Dimension and Utilization Thereof," which application is hereby incorporated herein by reference.

TECHNICAL FIELD

The present disclosure relates generally to digital communications, and more particularly to a system and method for generating codebooks with small projections per complex dimension and utilization thereof.

BACKGROUND

Sparse-code multiple access (SCMA) is a non-orthogonal multiple access scheme that allows multiple devices, users, or user equipments (UEs) to share channel resources in the code and power domain. Potential transmit devices are allocated time and frequency resources, also referred to as resource units.

SCMA is a codebook-based non-orthogonal multiplexing technique realized by the super-imposing of multi-dimensional codewords selected form SCMA codebooks. Instead of spreading of QAM symbols as in code division multiple access (CDMA) and low density signature (LDS), coded bits are directly mapped to multi-dimensional sparse complex codewords. One major benefit of SCMA codebooks is the shaping gain of multi-dimensional constellations over repetition coding of LDS spreading. SCMA is classified as a waveform/modulation and multiple access scheme. SCMA codewords are laid over multi-carrier tones such as OFDMA tones. In SCMA overloading is achievable with moderate complexity of detection thanks to the sparseness of SCMA codewords. SCMA can show noticeable gain over LDS especially for larger constellation sizes where the gain of constellation shaping is potentially larger. SCMA also provides system advantages due to its spreading and overloading capabilities. Interference whitening, open-loop user multiplexing and massive connectivity are some examples showing the benefit of SCMA from system point of view.

SUMMARY OF THE DISCLOSURE

Example embodiments of the present disclosure which provide a system and method for generating codebooks with small projections per complex dimension and utilization thereof.

In accordance with an example embodiment of the present disclosure, a method for data transmission by a device in a communication system is provided. The method includes modulating, by the device, a first data stream using a codebook to produce a second data stream, wherein the codebook is in correspondence with a multi-dimensional modulation map that includes a number of distinct projections per complex dimension that is smaller than a number of modulation points of the multi-dimensional modulation map, and transmitting, by the device, the second data stream over allocated resources in the communication system.

In accordance with another example embodiment of the present disclosure, a method for data receiving by a device in a communication system is provided. The method includes receiving, by the device, a first data stream over allocated resources in the communication system, and demodulating, by the device, the first data stream using a codebook to produce a second data stream, wherein the codebook is in correspondence with a multi-dimensional modulation map that includes a number of distinct projections per complex dimension that is smaller than a number of modulation points of the multi-dimensional modulation map.

In accordance with another example embodiment of the present disclosure, a device for data transmission in a communication system is provided. The device includes a processor, and a non-transitory computer readable storage medium storing programming for execution by the processor. The programming including instructions to configure the device to modulate a first data stream using a codebook to produce a second data stream, wherein the codebook is in correspondence with a multi-dimensional modulation map that includes a number of distinct projections per complex dimension that is smaller than a number of modulation points of the multi-dimensional modulation map, and transmit the second data stream over allocated resources in the communication system.

In accordance with another example embodiment of the present disclosure, a device for data receiving in a communication system is provided. The device includes a processor, and a non-transitory computer readable storage medium storing programming for execution by the processor. The programming including instructions to configure the device to receive a first data stream over allocated resources in the communication system, and demodulate the first data stream using a codebook to produce a second data stream, wherein the codebook is in correspondence with a multi-dimensional modulation map that includes a number of distinct projections per complex dimension that is smaller than a number of modulation points of the multi-dimensional modulation map.

One advantage of an embodiment is that codebooks with a small number of projects per tone, thereby reducing decoding complexity, are produced.

BRIEF DESCRIPTION OF THE DRAWINGS

For a more complete understanding of the present disclosure, and the advantages thereof, reference is now made to the following descriptions taken in conjunction with the accompanying drawing, in which.

DETAILED DESCRIPTION OF ILLUSTRATIVE EMBODIMENTS

The operating of the current example embodiments and the structure thereof are discussed in detail below. It should be appreciated, however, that the present disclosure provides many applicable inventive concepts that can be embodied in a wide variety of specific contexts. The specific embodiments discussed are merely illustrative of specific structures of the disclosure and ways to operate the disclosure, and do not limit the scope of the disclosure.

The present disclosure will be described with respect to example embodiments in a specific context, namely communications systems that use codebooks with small projections per complex dimension. The disclosure may be applied to standards compliant communications systems, such as those that are compliant with Third Generation Partnership Project (3GPP), IEEE 802.11, and the like, technical standards, and non-standards compliant communications systems, that use codebooks with small projections per complex dimension.

In sparse code multiple access (SCMA), data is spread over multiple time-frequency tones resources of orthogonal frequency division multiple access (OFDMA) resources (or any other types of orthogonal resources or multi-carrier modulation) through multi-dimensional codewords. Sparsity of codewords helps to reduce the complexity of joint detection of multiplexed SCMA layers by using message passing algorithm (MPA). In general, each layer of SCMA signal has its specific codebook set. Low density spreading (LDS) is a special case of SCMA. LDS as a form of multi-carrier CDMA (MC-CDMA) is used for multiplexing different layers of data. As opposed to SCMA with multi-dimensional codewords, LDS uses repetitions of the same (QAM) symbol on layer-specific nonzero position in time or frequency. As an example, in LDS-orthogonal frequency division multiplexing (LDS-OFDM) a QAM constellation point is repeated (with some possible phase rotations) over nonzero frequency tones of a LDS block. The shaping gain of multi-dimensional constellations is one of the advantages of SCMA over LDS. The gain is potentially high for higher order modulations where the repetition coding of LDS shows a large loss and poor performance.

SCMA is an encoding technique that encodes data streams, such as binary data streams, or in general, M-ary data streams, where M is an integer number greater than or equal to 2 into multidimensional codewords. SCMA directly encodes the data stream into multidimensional codewords and circumvents quadrature amplitude modulation (QAM) symbol mapping, which may lead to coding gain over conventional CDMA (and LDS) encoding. Notably, SCMA encoding techniques convey data streams using a multidimensional codeword rather than a QAM symbol.

Additionally, SCMA encoding provides multiple access through the use of different codebooks for different multiplexed layers, as opposed to the use of different spreading sequences for difference multiplexed layers, e.g., a LDS signatures in LDS, as is common in conventional CDMA encoding. Furthermore, SCMA encoding typically uses codebooks with sparse codewords that enable receivers to use low complexity algorithms, such as message passing algorithms (MPA), to detect respective codewords from combined codewords received by the receiver, thereby reducing processing complexity in the receivers.

CDMA is a multiple access technique in which data symbols are spread out over orthogonal and/or near orthogonal code sequences. Traditional CDMA encoding is a two-step process in which a binary code is mapped to a quadrature amplitude modulation (QAM) symbol before a spreading sequence is applied. While traditional CDMA encoding can provide relatively high data rates, new techniques/mechanisms for achieving even higher data rates are needed to meet the ever-growing demands of next-generation wireless networks. Low density spreading (LDS) is a form of CDMA used for multiplexing different layers of data. LDS uses repetitions of the same symbol on layer-specific nonzero position in time or frequency. As an example, in LDS-orthogonal frequency division multiplexing (OFDM) a constellation point is repeated (with some possible phase rotations) over nonzero frequency tones of a LDS block. Sparse code multiple access (SCMA) is a codebook-based non-orthogonal multiplexing technique realized by super-imposing of multi-dimensional codewords selected form SCMA codebooks. Instead of spreading of QAM symbols as in LDS, coded bits are directly mapped to multi-dimensional sparse complex codewords. The major benefit of SCMA codebooks is the shaping gain of multi-dimensional constellations over repetition coding of LDS spreading. SCMA is classified as a waveform/modulation and multiple access scheme. SCMA codewords are laid over multi-carrier tones such as OFDM. In SCMA overloading is achievable with moderate complexity of detection thanks to the sparseness of SCMA codewords. SCMA can show noticeable gain over LDS especially for larger constellation sizes where the gain of constellation shaping is potentially larger. Even though LDS may show poor link performance for larger constellation orders, it provides system advantages due to its spreading and overloading capabilities. Interference whitening, open-loop user multiplexing and massive connectivity are some examples showing the benefit of LDS from system point of view. SCMA is a spreading and multiplexing technique that offers all the system benefits of LDS, while it maintains or even improves the link performance in comparison with OFDMA. Therefore, SCMA brings the link advantages of OFDMA and system advantages of LDS all altogether.

Figure 1:
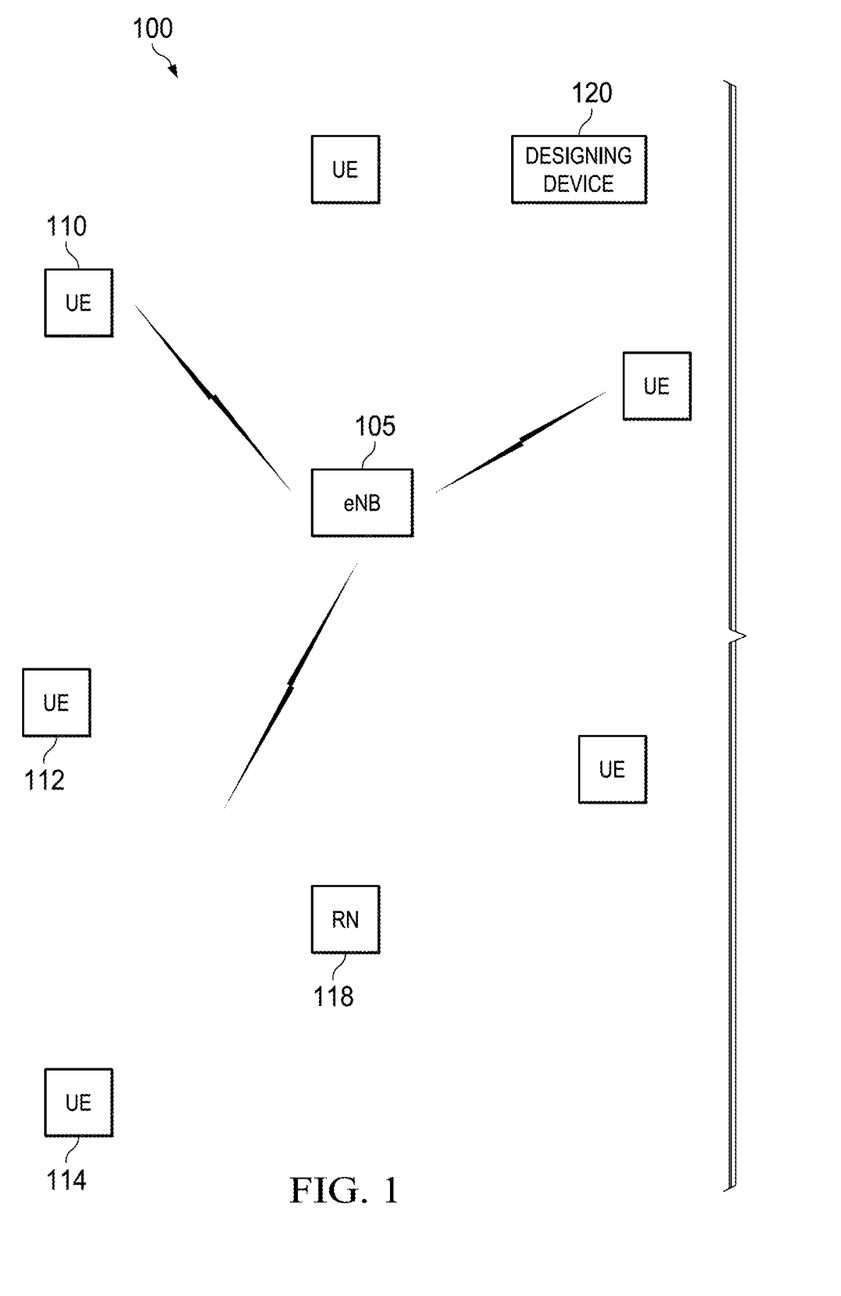
FIG. 1 illustrates an example communications system according to example embodiments described herein.

FIG. 1 illustrates an example communications system 100. Communications system 100 may support SCMA communications. Communications system 100 may include an evolved NodeB (eNB) 105 operating as a communications controller. Communications system 100 may also include user equipment (UE), such as UE 110, UE 112, and UE 114. eNB 105 may include multiple transmit antennas and multiple receive antennas to facilitate multiple input multiple output (MIMO) operation, wherein a single eNB (or transmit node) may simultaneously transmit multiple data streams to multiple users, a single user also with multiple receive antennas, or a combination thereof. Similarly, the UEs may include multiple transmit antennas and multiple receive antennas to support MIMO operation. In general, an eNB may also be referred to as a communications controller, a NodeB, a base station, a controller, and the like. Similarly, a UE may also be referred to as a mobile station, a mobile, a terminal, a user, a subscriber, and the like. Communications system 100 may also include a relay node (RN) 118 that is capable of utilizing a portion of resources of eNB 105 to help improve coverage and/or overall performance of communications system 100.

A designing device 120 may design SCMA codebooks with small projections per complex dimension for communications system 100 or a portion thereof. A single set of SCMA codebooks with small projections per complex dimension may be used by all devices in communications system 100. Different sets of SCMA codebooks with small projections per complex dimension may be used in different portions of communications system 100. Different sets of SCMA codebooks with small projections per complex dimension may be used by different communicating devices in communications system 100. It is noted that although shown in FIG. 1 as being a single stand-alone device, in other example embodiments, there may be multiple designing devices, each responsible for a different part of a communications system. Alternatively, designing device 120 may be co-located in other devices in communications system 100. As an example, some or all of the eNBs in communications system 100 may include designing devices.

While it is understood that communications systems may employ multiple eNBs capable of communicating with a number of UEs, only one eNB, one RN, and a number of UEs are illustrated for simplicity.

SCMA-OFDM is a code-domain multiplexing scheme over multicarrier modulation in which the spreading codebooks are sparse and hence detection can be made simpler. Spreading factor, sparsity of codebooks, and number of the maximum SCMA multiplexed layers are communications system parameters, in combination or separately, indicating the flexibility of the SCMA waveform. It is noted that in SCMA-OFDM applications, the complex dimension may be referred to as a frequency tone, or simply, a tone.

Figure 2:
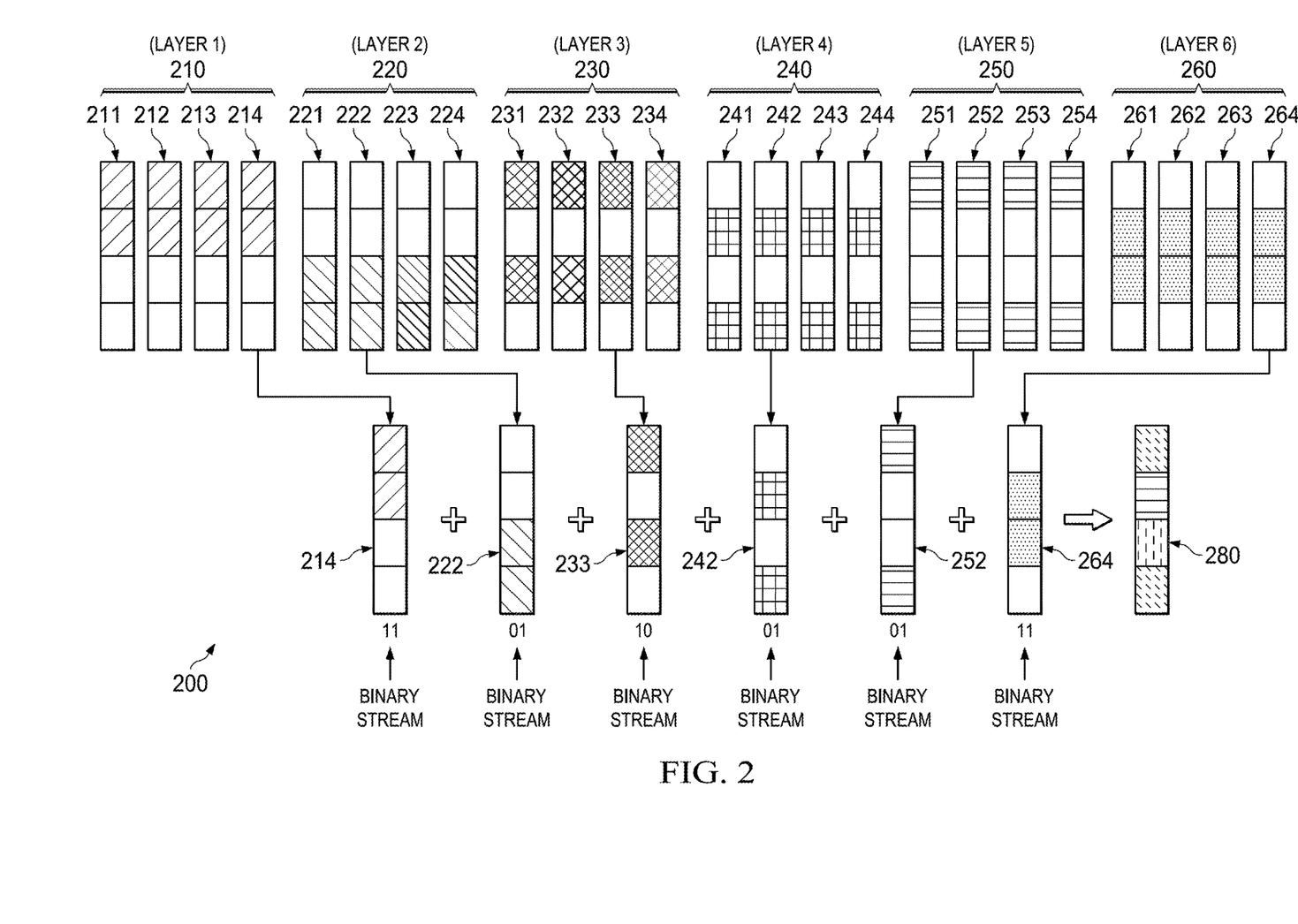
FIG. 2 illustrates an example SCMA multiplexing scheme for encoding data according to example embodiments described herein.

FIG. 2 illustrates an example SCMA multiplexing scheme 200 for encoding data. As shown in FIG. 2, SCMA multiplexing scheme 200 may utilize a plurality of codebooks, such as codebook 210, codebook 220, codebook 230, codebook 240, codebook 250, and codebook 260. Each codebook of the plurality of codebooks is assigned to a different multiplexed layer. Each codebook includes a plurality of multidimensional codewords. More specifically, codebook 210 includes codewords 211-214, codebook 220 includes codewords 221-224, codebook 230 includes codewords 231-234, codebook 240 includes codewords 241-244, codebook 250 includes codewords 251-254, and codebook 260 includes codewords 261-264.

Each codeword of a respective codebook may be mapped to a different data, e.g., binary, value. As an illustrative example, codewords 211, 221, 231, 241, 251, and 261 are mapped to binary value '00', the codewords 212, 222, 232, 242, 252, and 262 are mapped to the binary value '01', the codewords 213, 223, 233, 243, 253, and 263 are mapped to the binary value '10', and the codewords 214, 224, 234, 244, 254, and 264 are mapped to the binary value '11'. It is noted that although the codebooks in FIG. 2 are depicted as having four codewords each, SCMA codebooks in general may have any number of codewords. As an example, SCMA codebooks may have 8 codewords (e.g., mapped to binary values '000' . . . '111'), 16 codewords (e.g., mapped to binary values '0000' . . . '1111'), or more.

As shown in FIG. 2, different codewords are selected from various codebooks 210, 220, 230, 240, 250, and 260 depending on the binary data being transmitted over the multiplexed layers. In this example, codeword 214 is selected from codebook 210 because the binary value '11' is being transmitted over the first multiplexed layer, codeword 222 is selected from codebook 220 because the binary value '01' is being transmitted over the second multiplexed layer, codeword 233 is selected from codebook 230 because the binary value '10' is being transmitted over the third multiplexed layer, codeword 242 is selected from codebook 240 because the binary value '01' is being transmitted over the fourth multiplexed layer, codeword 252 is selected from codebook 250 because the binary value '01' is being transmitted over the fifth multiplexed layer, and codeword 264 is selected from codebook 260 because the binary value '11' is being transmitted over the sixth multiplexed layer. Codewords 214, 222, 233, 242, 252, and 264 may then be multiplexed together to form multiplexed data stream 280, which is transmitted over shared resources of a network. Combination of layers may happen either at a transmit device (as in DL) or over the air (as in UL) or both (as in DL CoMP). Notably, codewords 214, 222, 233, 242, 252, and 264 are sparse codewords, and therefore can be identified upon reception of multiplexed data stream 280 using a low complexity algorithm, such as a message passing algorithm (MPA).

In summary, the SCMA multiplexing enables non-orthogonal multiple access with enhanced spectrum efficiency, lower latency, lower signaling overhead, and the like. The SCMA waveform also supports overloading where data for multiple users are combined to increase overall data rate and connectivity. The sparsity present in SCMA codewords limits detection complexity. While multi-dimensional codewords allow for shaping gain and better spectral efficiency with spreading for robust link-adaptation.

Figure 3:
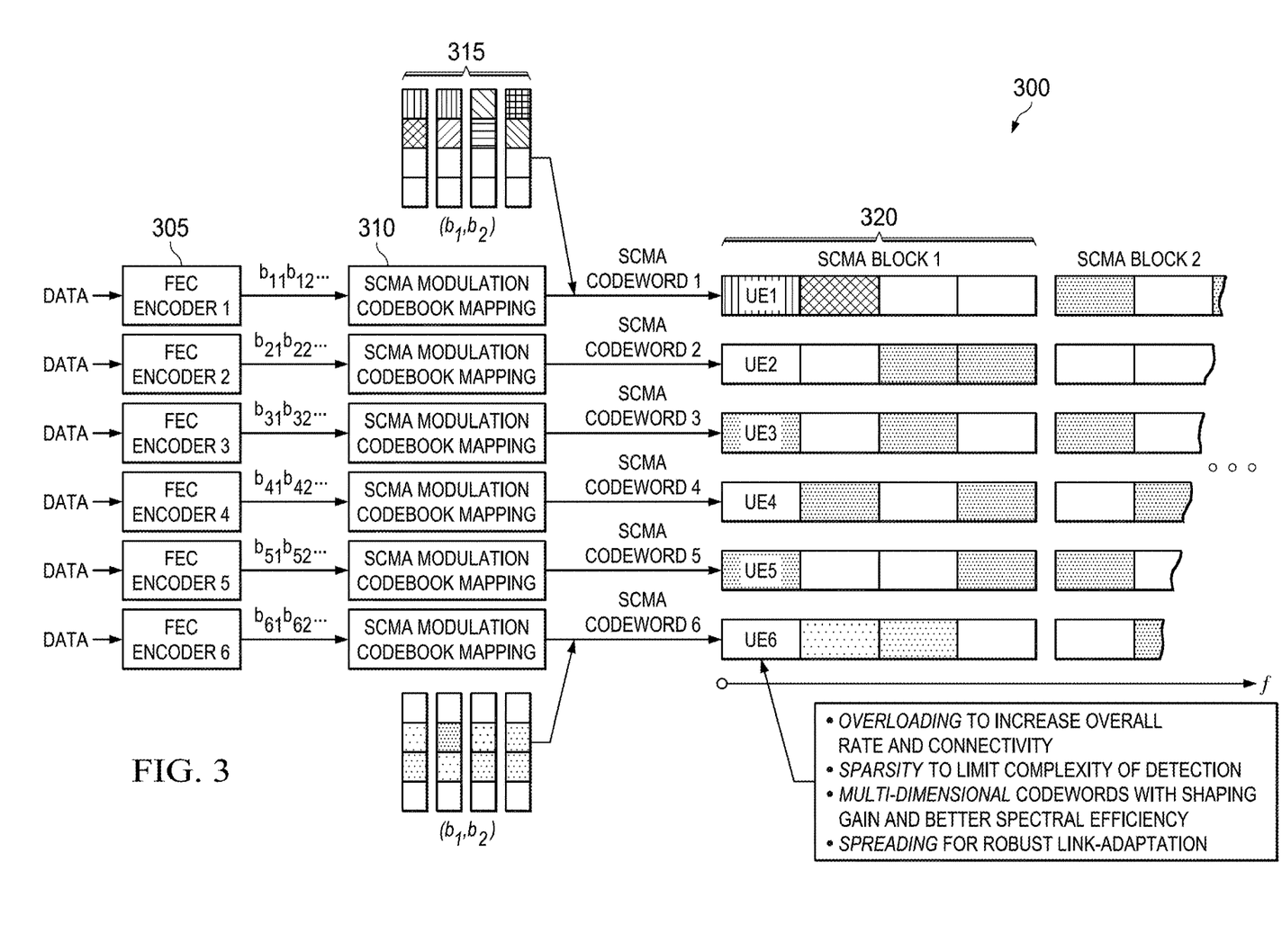
FIG. 3 illustrates an example SCMA multiplexing and an example process of data being modulated with example SCMA codebooks to fill SCMA blocks according to example embodiments described herein.

FIG. 3 illustrates a diagram 300 of an example SCMA multiplexing and an example process of data being modulated with example SCMA codebooks to fill SCMA blocks. Data to be transmitted are provided to forward error correcting code (FEC) encoders, such as FEC encoder 305, to produce encoded data for different users. The data for different users is provided to SCMA modulation codebook mapping units, such as SCMA modulation codebook mapping unit 310, to produce SCMA codewords, such as SCMA codewords 315. First SCMA codewords are inserted into SCMA block 320. It is noted that as shown in FIG. 3, every layer has a FEC or payload. In general, the number of FECs or payloads may be less than the number of layers, which may mean that output bits of a layer can be provided to more than one SCMA modulation codebook mapping unit. Furthermore, one or more layers may be assigned to a single user.

As discussed previously, the decoding, or in other term, demodulating, of SCMA codewords may be based on implementations of MPA. The decoding complexity is proportional to $m^D m^k$ where m is the number of distinct projections of codebook points per non-zero complex dimension (or non-zero tone) and Dk is the number of overlapping layers per complex dimension. In general, when different constellations have different number of points projected and overlapped over the same dimension, the complexity is proportional to $\Pi_{d=1}^{D} m_d$, where $m_d$ is the number of points in the projection of the codebook associated with constellation set d=1, . . . , D.

In SCMA, different codebooks may be constructed by mapping a mother constellation to different subsets of complex dimensions. According to an example embodiment, systems and methods for generating the mother constellation are provided. According to an example embodiment, minimizing the number of distinct projections of constellation points per complex dimension results in a reduction in the computational complexity of the MPA used in SCMA decoding. As an example, reducing the number of distinct projections per complex dimension to less than the number of distinct constellation points results in a reduction in the computational complexity. Co-assigned U.S. patent application Ser. No. 13/730,355, entitled "Systems and Methods for Sparse Code Multiple Access," filed Dec. 28, 2012, which is hereby incorporated herein by reference, presents a detailed discussion of SCMA, SCMA decoding, generation of codebooks from mother constellations, and the like. Co-assigned U.S. patent application Ser. No. 13/919,918, entitled "System and Method for Designing and Using Multidimensional Constellations," filed Jun. 17, 2013, which is hereby incorporated herein by reference, presents techniques wherein a rotation, such as a unitary rotation, is applied to a SCMA constellation to reduce the number of projections per complex dimension.

According to an example embodiment, systems and methods are presented to generate SCMA constellations that have small numbers of projections per complex dimension, with or without application of a rotation.

Figure 4:
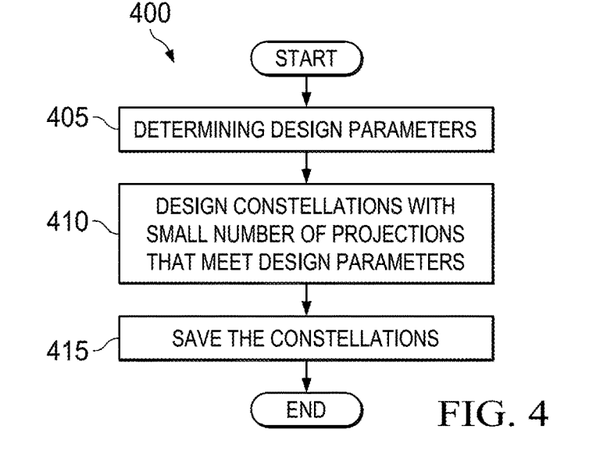
FIG. 4 illustrates a flow diagram of example operations occurring in the generation of constellations with small projections per complex dimension (or tone) according to example embodiments described herein.

FIG. 4 illustrates a flow diagram of example operations 400 occurring in the generation of constellations with small projections per complex dimension. Operations 400 may occur in a designing device, such as designing device 120, or a network entity configured to generate constellations with small projections per complex dimension.

Operations 400 may begin with the designing device determining design parameters (block 405). The design parameters may be provided by a user of the designing device. The design parameters may be generated from performance requirements and/or parameters. Examples of design parameters may include constellation size, number of constellation points, number of non-zero elements of a codeword, peak to average power ratio (PAPR), number of dimensions, and the like. The designing device may design multi-dimensional constellations (or simply, constellations) with small number of projections that meet the design parameters (block 410). According to an example embodiment, constellations are designed based on the criterion of having small number of projections per complex dimension instead of separately designing a constellation and then selecting a unitary rotation as described previously.

In general, to have good performance on a communications channel (especially on the uplink fading channel) dependency among the projections of the constellation points on different complex dimensions is desirable. However, the dependencies may also increase the number of projections per complex dimension. Hence, there may be a trade-off between complexity and performance. For small constellations, the selection of the constellations and labeling of constellation points (which may be referred to as designing a constellation) may be performed by utilizing case-based optimization. Some example constellations are provided below. For larger constellation, designing a constellation may include the designing of desired projection points at each complex dimension using multi-dimensional constellations and labeling of input bits to the projection points. Detailed discussions of example embodiments of designing constellations are provided below. The designing device may save the constellations (block 415). The designing device may save the constellations (or information about the constellations) in a local memory, a remote memory, a local database, a remote database, and the like. As an illustrative example, the information about the constellations may include number of points, locations of the points, number of complex dimensions, labeling of the points, and the like.

As discussed previously, SCMA constellations that have small numbers of projections per complex dimension may have lower decoding complexity than SCMA constellations that have large numbers of projections per complex dimension. This may be especially true when a MPA receiver is used for decoding.

According to an example embodiment, SCMA constellations are designed to have small projections per complex dimension. For larger constellations, lattice constellations which are subsets of an integer lattice and have small determinants are chosen for designing constellations. The small determinant of a sub-lattice of the integer lattice (or a translated version of the integer lattice) helps to ensure that the number of projections is small compared to the total number of constellation points. However, in order to help ensure good performance, some dependency among complex dimensions is maintained. Example lattice constellations include constellations from lattice $D_{2n}$ or lattices such as $E_8$.

The points of the chosen lattice which are inside a chosen region define an overall multi-dimensional constellation. An example of the chosen region may be a hypercube. Other examples may include Voronoi region of another lattice or a scaled version of the constellation lattice. Typically, if the length of a side of a hypercube is denoted a, the number of complex dimensions is denoted n, and the determinant of the chosen lattice is an integer d, then the number of constellation points is expressible as $(a^{2n})/d$. The number of projections per complex dimension is at most $a^2$, which may be much smaller than $(a^{2n})/d$. An uncoded rate of the transmissions per SCMA layer is then equal to $\log_2((a^{2n})/d)$. The constellation points may be labeled using labeling methods for lattice codes, such as those discussed in G. D. Forney, "Coset codes—part II: Binary lattices and related codes", IEEE Trans. Info. Theory, September 1988), which is incorporated herein by reference.

According to an example embodiment, systems and methods are presented to generate SCMA constellations with low PAPR. Such SCMA constellations may be a special case of the SCMA constellations with small numbers of projections per complex dimension and may be designed using techniques similar to those presented herein for designing SCMA constellations with small numbers of projections per complex dimension or using special techniques applicable to low PAPR SCMA constellations.

As an illustrative example, in a special case where each constellation point of a SCMA constellation has only one nonzero component and the SCMA dimensions are mapped to the resource elements of OFDM in one symbol, the resulting SCMA codebook also has a minimal PAPR property. High PAPR communications generally require transmitters with increased complexity of analog-to-digital converters (ADC) and digital-to-analog converters (DAC), as well as reduced efficiency of radio frequency (RF) power amplifier(s). High PAPR also places a stringent requirement on the RF power amplifier and reduces their efficiency since higher input power backoff factors are needed before the peaks in the signal experience significant distortion due to power amplifier nonlinearity. Hence PAPR reduction is typically desirable.

Moderate PAPR reduction may be achieved when the number of nonzero components of a constellation point (or codeword) is less than the total length of the codeword. For higher data rates, when achieving the minimal PAPR is not possible, moderate PAPR reduction may be achieved by having asymmetric components for constellation points.

According to an example embodiment, SCMA constellations are designed to have low PAPR. It is noted that when each constellation point has non-zero component only in one complex dimension, the resulting codebook has minimal PAPR property in OFDM-SCMA communications. It may be possible to construct a SCMA constellation on K available complex dimensions as a union of K sub-constellations where an i-th sub-constellation has non-zero components only on the i-th available complex dimension, where ($1 \leq i \leq k$, $k=1, \ldots, K$). If phase shift keying (PSK) sub-constellations are selected, a SCMA constellation with 0 db PAPR results. When achieving the minimal PAPR property is not possible, such as for higher rates, moderate PAPR reduction may be achieved by having more than one non-zero components (but still enforcing a requirement that the number of non-zero components is still less than the total number of available tones), or by having asymmetric components for constellation points (e.g., each constellation point may have 16 QAM projection on one complex dimension and small QPSK projection on other complex dimension(s)).

According to an example embodiment, dimension-switched PSK constellations are used for minimal PAPR. It may be possible to construct a SCMA constellation on K complex dimensions as a union of K sub-constellations where each of the sub-constellations is a PSK constellation on one complex dimension and has zero components on other complex dimension(s), e.g., K sub-constellations on K complex dimensions. In an embodiment, the "zero components on complex dimension" means that there is no transmission over the resource, and in some embodiments, it may further mean that there is no intention to transmit over the resource. In general, different PSK sub-constellations may have different phase offsets. Labeling of the constellation points may utilize a concatenation of the labeling of the sub-constellations and a Gray labeling of the PSK sub-constellations, for example. Usually, asymmetric PSK (with unequal phase distances) may also be used. The use of asymmetric PSK may be particularly useful for small constellations when labeling and the points of each sub-constellation may be optimized jointly to trade-off between an overall minimum distance and a distance of codewords with high Hamming distance. As an illustrative example, each constellation point of a multi-dimensional constellation may have a 16-ary quadrature amplitude modulation (16-QAM) projection on one complex dimension and a small quadrature phase shift keying (QPSK) projection on other complex dimension(s).

Figure 5A:
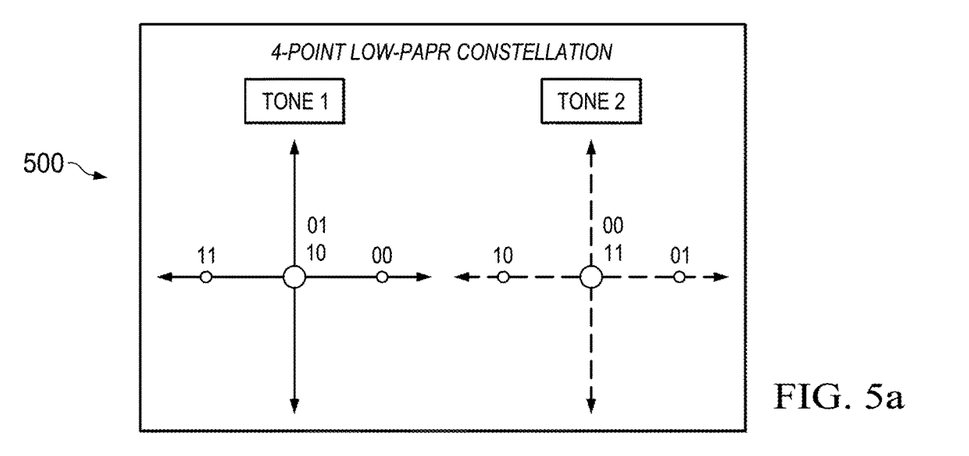
FIG. 5a illustrates an example 4-point low peak to average power ratio (PAPR) two-dimensional constellation according to example embodiments described herein.
Figure 5B:
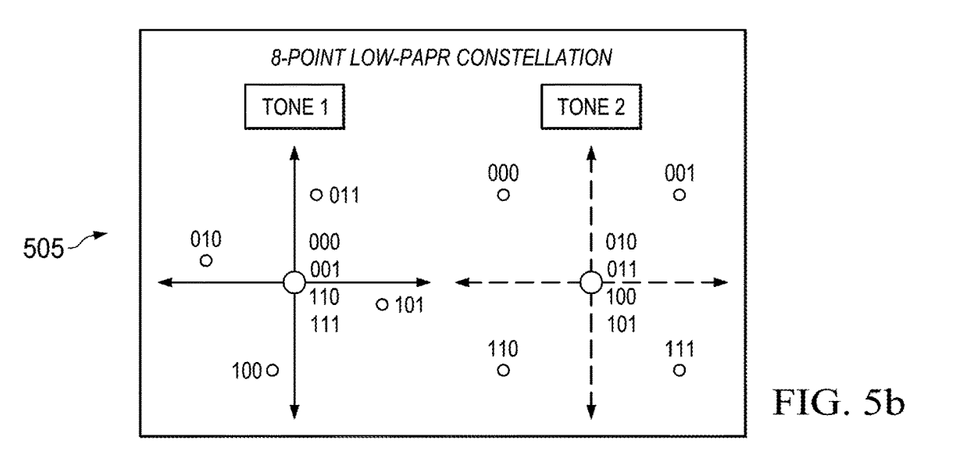
FIG. 5b illustrates an example 8-point low PAPR two-dimensional constellation according to example embodiments described herein.

FIG. 5a illustrates an example 4-point low PAPR two-dimensional constellation 500. 4-point low PAPR two-dimensional constellation 500 includes two complex dimensions. FIG. 5b illustrates an example 8-point low PAPR two-dimensional constellation 505. 8-point low PAPR two-dimensional constellation 505 includes two complex dimensions. Table 1 displays PAPR for example 4-point and 8-point two-dimensional constellation where an OFDM symbol carries one SCMA block or two SCMA blocks.

TABLE 1

PAPR for example 4-point and 8-point two-dimensional constellations.

| Codebook | PAPR for one SCMA block | PAPR for two SCMA blocks |
| --- | --- | --- |
| 4-point Best | 2 dB | 5 dB |
| 4-point low PAPR | 0 dB | 3 dB |
| 8-point Best | 2.5 dB | 5.1 dB |
| 8-point low PAPR | 0 dB | 3 dB |

An example of a 4-point low-PAPR constellation over 2 tones in form of a modulation map is shown in Table 2.

TABLE 2

4-point low-PAPR constellation over 2 tones: Tone-switched BPSK over 2 tones

| Bit | $I_1$ | $Q_1$ | $I_2$ | $Q_2$ |
| --- | --- | --- | --- | --- |
| 00 | 1 | 0 | 0 | 0 |
| 01 | 0 | 0 | 1 | 0 |
| 11 | −1 | 0 | 0 | 0 |
| 10 | 0 | 0 | −1 | 0 |

Figure 6:
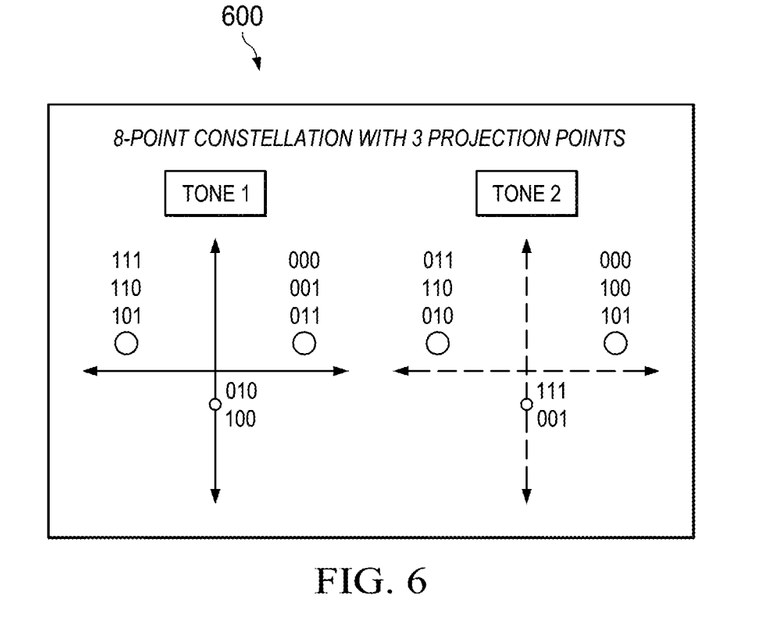
FIG. 6 illustrates an example 8-point two-dimensional constellation with 3 projection points per complex dimension (or tone) according to example embodiments described herein.

FIG. 6 illustrates an example 8-point two-dimensional constellation 600 with 3 projection points. 8-point two-dimensional constellation 600 may be designed using ad hoc joint optimization of labeling and constellation points. Examples of 8-point low-PAPR constellations over 2 tones in form of a modulation map are shown in Table 3 and Table 4.

TABLE 3

8-point low-PAPR constellation over 2 tones (5 projections per tone): Tone-switched QPSK over 4 tones

| Bit | $I_1$ | $Q_1$ | $I_2$ | $Q_2$ |
| --- | --- | --- | --- | --- |
| 000 | 0 | 0 | 1 | 0 |
| 001 | 0 | 0 | 0 | 1 |
| 111 | 0 | 0 | −1 | 0 |
| 110 | 0 | 0 | 0 | −1 |
| 010 | 1 | 0 | 0 | 0 |
| 100 | 0 | 1 | 0 | 0 |
| 101 | −1 | 0 | 0 | 0 |
| 011 | 0 | −1 | 0 | 0 |

TABLE 4

8-point small-projection constellation over 2 tones (3 projections per tone)

| Bit | $I_1$ | $Q_1$ | $I_2$ | $Q_2$ |
| --- | --- | --- | --- | --- |
| 111 | −1 | 0.2 | 0 | −0.6 |
| 110 | −1 | 0.2 | −1 | 0.2 |
| 101 | −1 | 0.2 | 1 | 0.2 |

TABLE 4-continued 8-point small-projection constellation
over 2 tones (3 projections per tone)

| Bit | $I_1$ | $Q_1$ | $I_2$ | $Q_2$ |
|---|---|---|---|---|
| 100 | 1 | 0.2 | 1 | 0.2 |
| 010 | 1 | 0.2 | −1 | 0.2 |
| 000 | 1 | 0.2 | 1 | 0.2 |
| 001 | 0 | −0.6 | 0 | −0.6 |
| 011 | 0 | −0.6 | −1 | 0.2 |

Figure 7:
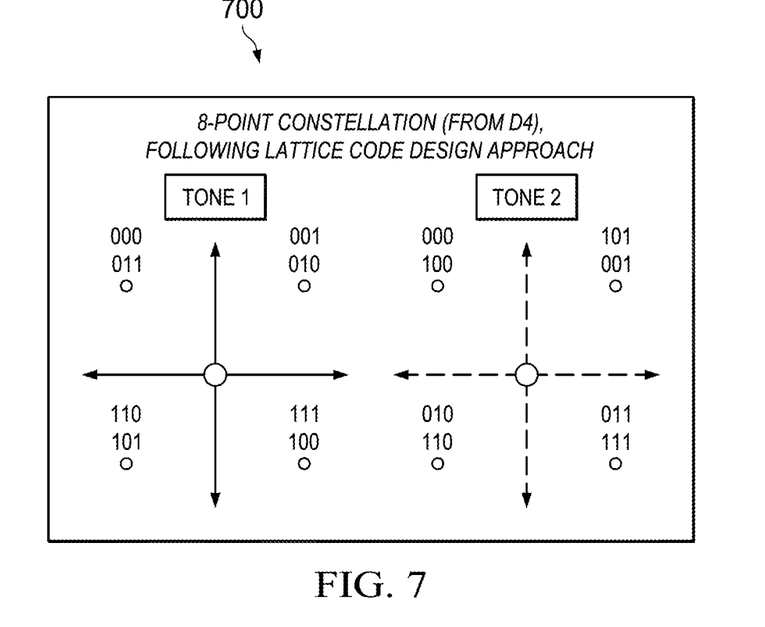
FIG. 7 illustrates an example 8-point two-dimensional constellation according to example embodiments described herein.

FIG. 7 illustrates an example 8-point two-dimensional constellation 700. 8-point two-dimensional constellation 700 may be designed from lattice $D_4$ following the lattice code design approach described previously. Table 5 provides a modulation map for an example 8-point small-projection constellation over 2 tones.

TABLE 5

8-point small-projection constellation over 2 tones
(4 projections per tone, obtained from D4 lattice)

| Bit | $I_1$ | $Q_1$ | $I_2$ | $Q_2$ |
|---|---|---|---|---|
| 001 | 1 | 1 | 1 | 1 |
| 010 | 1 | 1 | −1 | −1 |
| 000 | −1 | 1 | −1 | 1 |
| 011 | 1 | −1 | 1 | −1 |
| 110 | −1 | −1 | −1 | −1 |
| 101 | −1 | −1 | 1 | 1 |
| 111 | 1 | −1 | 1 | −1 |
| 100 | −1 | 1 | −1 | 1 |

Figure 8:
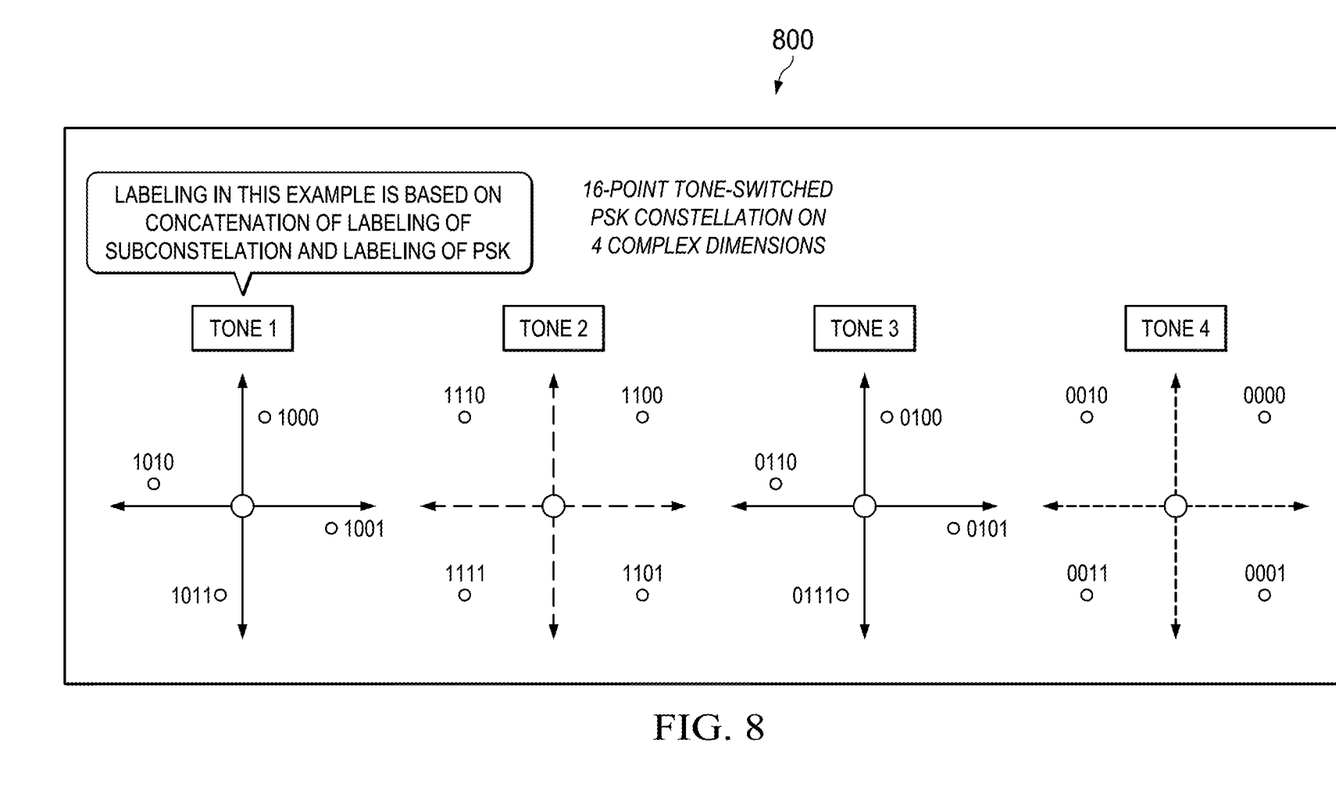
FIG. 8 illustrates an example 16-point four-dimensional constellation with minimal PAPR on four complex dimension designed using dimension switched PSK constellations according to example embodiments presented herein.

FIG. 8 illustrates an example 16-point four-dimensional constellation 800 with minimal PAPR on four complex dimensions. 16-point four-dimensional constellation 800 may be designed using dimension switched PSK constellations. 16-point four-dimensional constellation 800 features minimal PAPR constellations on 4 complex dimensions. The labeling of the constellation points shown in FIG. 8 is based on concatenation of sub-constellations and labeling of the PSK sub-constellations. Table 6 provides a modulation map for an example 16-point low-PAPR constellation over 2 tones.

TABLE 6

16-point low-PAPR constellation over 2 tones (9 projections per tone): Tone-switched 8PSK over 2 tones

| Bit Label | $I_1$ | $Q_1$ | $I_2$ | $Q_2$ |
|---|---|---|---|---|
| 0000 | Real{$e^0$} | Imag{$e^0$} | 0 | 0 |
| 0010 | Real{$e^{\pi j/4}$} | Imag{$e^{\pi j/4}$} | 0 | 0 |
| 0110 | Real{$e^{2\pi j/4}$} | Imag{$e^{2\pi j/4}$} | 0 | 0 |
| 0100 | Real{$e^{3\pi j/4}$} | Imag{$e^{3\pi j/4}$} | 0 | 0 |
| 0101 | Real{$e^{4\pi j/4}$} | Imag{$e^{4\pi j/4}$} | 0 | 0 |
| 0111 | Real{$e^{5\pi j/4}$} | Imag{$e^{5\pi j/4}$} | 0 | 0 |
| 0011 | Real{$e^{6\pi j/4}$} | Imag{$e^{6\pi j/4}$} | 0 | 0 |
| 0001 | Real{$e^{7\pi j/4}$} | Imag{$e^{7\pi j/4}$} | 0 | 0 |
| 1000 | 0 | 0 | Real{$e^0$} | Imag{$e^0$} |
| 1010 | 0 | 0 | Real{$e^{\pi j/4}$} | Imag{$e^{\pi j/4}$} |
| 1110 | 0 | 0 | Real{$e^{2\pi j/4}$} | Imag{$e^{2\pi j/4}$} |
| 1100 | 0 | 0 | Real{$e^{3\pi j/4}$} | Imag{$e^{3\pi j/4}$} |
| 1101 | 0 | 0 | Real{$e^{4\pi j/4}$} | Imag{$e^{4\pi j/4}$} |
| 1111 | 0 | 0 | Real{$e^{5\pi j/4}$} | Imag{$e^{5\pi j/4}$} |
| 1011 | 0 | 0 | Real{$e^{6\pi j/4}$} | Imag{$e^{6\pi j/4}$} |
| 1001 | 0 | 0 | Real{$e^{7\pi j/4}$} | Imag{$e^{7\pi j/4}$} |

Figure 9:
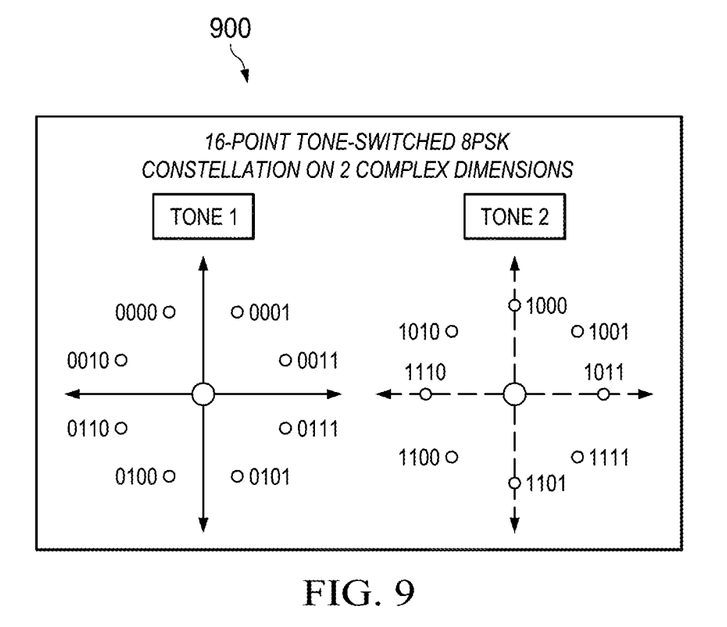
FIG. 9 illustrates an example 16 point two-dimensional constellation with minimal PAPR on two complex dimension according to example embodiments presented herein.

FIG. 9 illustrates an example 16 point two-dimensional constellation 900 with minimal PAPR on two complex dimensions. 16 point two-dimensional constellation 900 may be designed using dimension switched 8PSK constellations. 16-point two-dimensional constellation 900 features minimal PAPR constellation on 2 complex dimensions. Table 7 provides a modulation map for an example 16-point low-PAPR constellation over 4 tones.

TABLE 7

16-point low-PAPR constellation over 4 tones (5 projections per tone): Tone-switched QPSK over 4 tones

| Bit Label | $I_1$ | $Q_1$ | $I_2$ | $Q_2$ | $I_3$ | $Q_3$ | $I_4$ | $Q_4$ |
|---|---|---|---|---|---|---|---|---|
| 0000 | 1 | 0 | 0 | 0 | 0 | 0 | 0 | 0 |
| 1111 | −1 | 0 | 0 | 0 | 0 | 0 | 0 | 0 |
| 1000 | 0 | 1 | 0 | 0 | 0 | 0 | 0 | 0 |
| 0111 | 0 | −1 | 0 | 0 | 0 | 0 | 0 | 0 |
| 0100 | 0 | 0 | 1 | 0 | 0 | 0 | 0 | 0 |
| 1011 | 0 | 0 | −1 | 0 | 0 | 0 | 0 | 0 |
| 0010 | 0 | 0 | 0 | 1 | 0 | 0 | 0 | 0 |
| 1101 | 0 | 0 | 0 | −1 | 0 | 0 | 0 | 0 |
| 0001 | 0 | 0 | 0 | 0 | 1 | 0 | 0 | 0 |
| 1110 | 0 | 0 | 0 | 0 | −1 | 0 | 0 | 0 |
| 1100 | 0 | 0 | 0 | 0 | 0 | 1 | 0 | 0 |
| 0011 | 0 | 0 | 0 | 0 | 0 | −1 | 0 | 0 |
| 1010 | 0 | 0 | 0 | 0 | 0 | 0 | 1 | 0 |
| 0101 | 0 | 0 | 0 | 0 | 0 | 0 | −1 | 0 |
| 1001 | 0 | 0 | 0 | 0 | 0 | 0 | 0 | 1 |
| 0110 | 0 | 0 | 0 | 0 | 0 | 0 | 0 | −1 |

In the all the modulation map tables presented herein, $I_1$ and $Q_1$ are associated with one tone, and $I_2$ and $Q_2$ are associated with another tone, etc. The order of the tones as listed in the table is not to be considered as a limitation. The modulation map in the tables may be used as a whole table or as a subset of the table including one or more of modulation map of bits, such as "00", "01", "11" and "10". It should also be understood that the tables aforementioned are examples of the modulation map in accordance with the constellations. Variations of the constellations, for example, changing phases for all projections on one tone, or increasing or decreasing the amplitude of all points does not substantially change the constellation.

Figure 10:
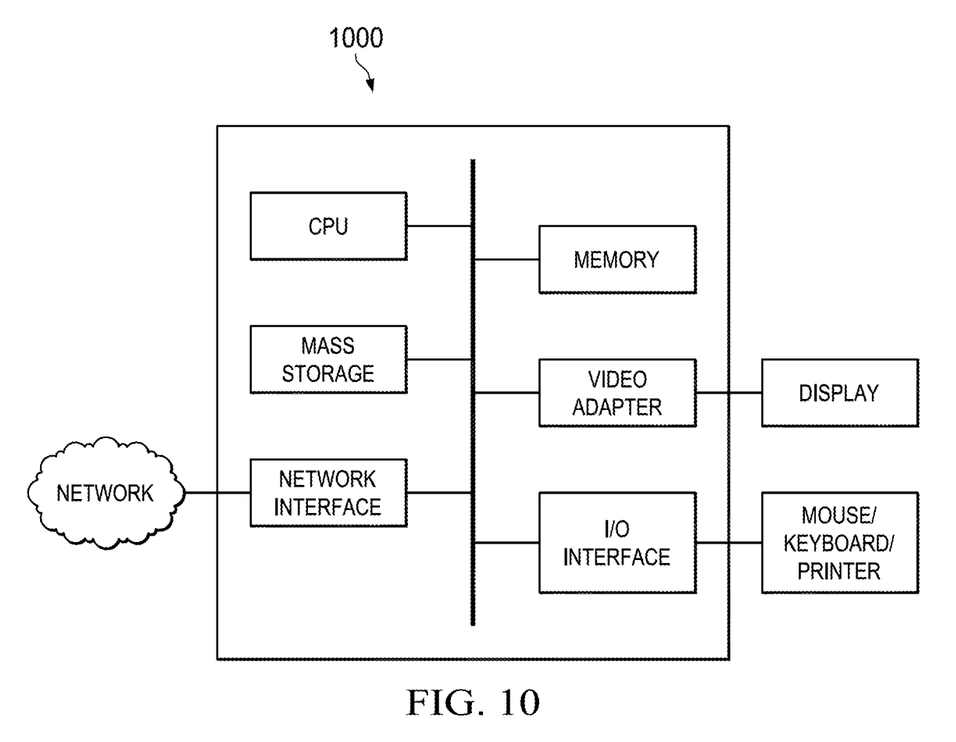
FIG. 10 is a block diagram of an example processing system that may be used for implementing the devices and methods disclosed herein.

FIG. 10 is a block diagram of an example processing system 1000 that may be used for implementing the devices and methods disclosed herein. Specific devices may utilize all of the components shown, or only a subset of the components, and levels of integration may vary from device to device. Furthermore, a device may contain multiple instances of a component, such as multiple processing units, processors, memories, transmitters, receivers, etc. The processing system may comprise a processing unit equipped with one or more input/output devices, such as a speaker, microphone, mouse, touchscreen, keypad, keyboard, printer, display, and the like. The processing unit may include a central processing unit (CPU), memory, a mass storage device, a video adapter, and an I/O interface connected to a bus.

The bus may be one or more of any type of several bus architectures including a memory bus or memory controller, a peripheral bus, video bus, or the like. The CPU may comprise any type of electronic data processor. The memory may comprise any type of system memory such as static random access memory (SRAM), dynamic random access memory (DRAM), synchronous DRAM (SDRAM), read-only memory (ROM), a combination thereof, or the like. In an embodiment, the memory may include ROM for use at boot-up, and DRAM for program and data storage for use while executing programs.

The mass storage device may comprise any type of storage device configured to store data, programs, and other information and to make the data, programs, and other information accessible via the bus. The mass storage device may comprise, for example, one or more of a solid state drive, hard disk drive, a magnetic disk drive, an optical disk drive, or the like.

The video adapter and the I/O interface provide interfaces to couple external input and output devices to the processing unit. As illustrated, examples of input and output devices include the display coupled to the video adapter and the mouse/keyboard/printer coupled to the I/O interface. Other devices may be coupled to the processing unit, and additional or fewer interface cards may be utilized. For example, a serial interface such as Universal Serial Bus (USB) (not shown) may be used to provide an interface for a printer.

The processing unit also includes one or more network interfaces, which may comprise wired links, such as an Ethernet cable or the like, and/or wireless links to access nodes or different networks. The network interface allows the processing unit to communicate with remote units via the networks. For example, the network interface may provide wireless communication via one or more transmitters/transmit antennas and one or more receivers/receive antennas. In an embodiment, the processing unit is coupled to a local-area network or a wide-area network for data processing and communications with remote devices, such as other processing units, the Internet, remote storage facilities, or the like.

Figure 11:
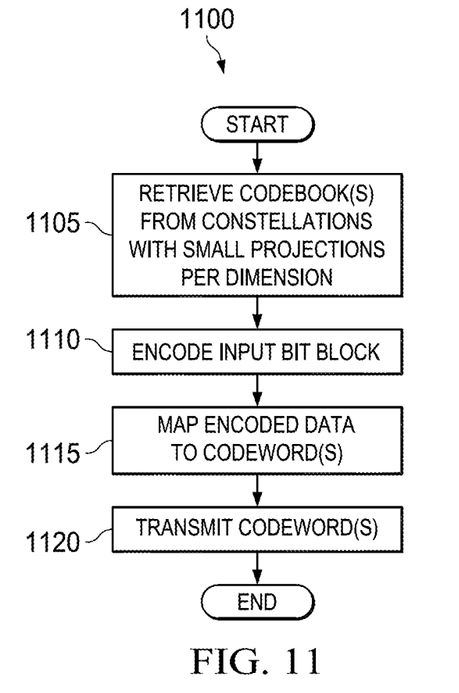
FIG. 11 illustrates a flow diagram of example operations occurring in the transmission of data using codebooks derived from constellations with small projections per complex dimension according to example embodiments described herein.

FIG. 11 illustrates a flow diagram of example operations 1100 occurring in the transmission of data using codebook(s) derived from constellations with small projections per complex dimension. Operations 1100 may be indicative of operations occurring in a transmitting device, such as an eNB for downlink transmissions or a UE for uplink transmissions.

Operations 1100 may begin with the transmitting device retrieving codebook(s) derived from constellations with small projections per complex dimension (block 1105). The codebook(s) may be retrieved from local memory, remote memory, a local database, a remote database, and the like. The transmitting device may encode an input bit block (block 1110). The input bit block may be part of a first data stream. The input bit block may be encoded using a FEC encoder, for example, to produce encoded data. The encoded data may be mapped to codeword(s) using the retrieved codebook(s) (block 1115). The codewords may be part of a second data stream. The transmitting device may transmit the codewords (block 1120).

Figure 12:
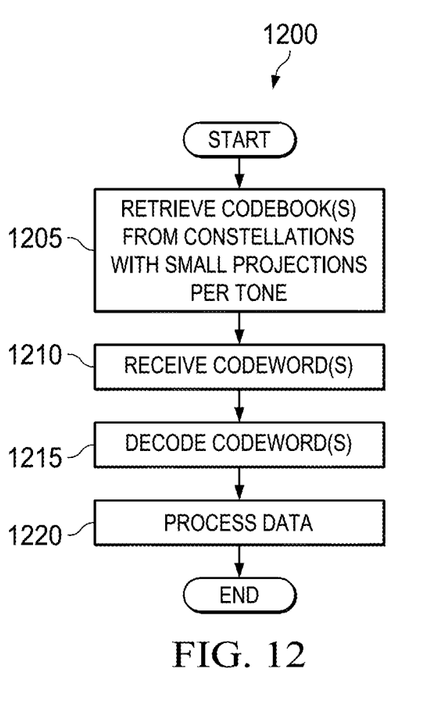
FIG. 12 illustrates a flow diagram of an example operations occurring in the reception of data using codebooks derived from constellations with small projections per complex dimension according to example embodiments described herein.

FIG. 12 illustrates a flow diagram of an example operations 1200 occurring in the reception of data using codebook(s) derived from constellations with small projections per complex dimension. Operations 1200 may be indicative of operations occurring in a receiving device, such as an eNB for uplink transmissions or a UE for downlink transmissions.

Operations 1200 may begin with the receiving device retrieving codebook(s) derived from constellations with small projections per complex dimension (block 1205). The codebooks may be retrieved from local memory, remote memory, a local database, a remote database, and the like. The receiving device may receive codeword(s) (block 1210). The received codewords may be part of a first data stream. The receiving device may decode the codeword(s) (block 1215). The receiving device may use a decoding algorithm, such as MPA, and the codebook(s) to decode the codeword(s and produce data. The data may be part of a second data stream. The receiving device may process the data (block 1220).

A method to design SCMA codebooks with low projections per non-zero dimension is provided. The method includes designing multi-dimensional constellations with low projections per dimension using lattice constellations in a particular method to design low projection constellations. The method includes appropriate labeling of constellation points. The method includes building SCMA codebooks based on the multi-dimensional constellations. The method includes a criterion for constellation design with low projections per complex dimension. A method to design SCMA codebooks with low PAPR with one non-zero element using tone switched PSK and labeling.

It is noted that in variations of embodiments of this application, the constellation or constellation map may also be referred to as a modulation map. So, the multi-dimension constellation may also be referred to as a multi-dimension modulation map. In accordance with embodiments of the application, multi-dimension may refers to two or more dimension. The dimensions may refer to time and/or frequency dimensions and resource units therein, which are capable of transmitting independent symbols.

In various embodiments of the application, the codebook may also be referred as a spread constellation or a spread modulation map. The spread constellation or spread modulation map may be achieved by applying a signature, which may also be called as spreading sequence, to a constellation. The codeword mentioned in embodiments of the application may also be called as spread constellation point.

In accordance with an embodiment of the application, in a SCMA system, the transmitter and the receiver in either uplink or downlink need to use the same codebook for successive communication. There are several ways to ensure that the same codebook(s) are used at both sides.

In various embodiments, a procedure is used to make sure that the codebook used by the transmitter receiver pair is the same. Please note that these scenarios illustrate only some examples and do not preclude combination of these options together or with alternative IDs in the network.

In one example embodiment, the network assigns the codebooks to the users in either or both directions (UL/DL) and informs the user through high layer signaling. The assigned codebook may remain fixed or change over time/frequency. The high layer signaling may be Radio Resource Control signaling. The following example cases illustrate this.

Case 1: Fixed codebook. The codebook assigned to a user remains fixed for the entire time/frequency and does not change until a subsequent high layer signaling.

Case 2: Rotation codebook. The user receives an indication of a method of selecting the codebook based on the signaling combined with time/frequency index (such as adding the time to the codebook index, for example). Both network and user use the same method to ensure that the same codebook is used for transmission and reception.

Case 3: Pseudo random selection. The user receives a random seed through higher layer signaling and uses an agreed upon random generator to determines the codebook to use in communications. The network also uses the same random generator and seed to remain synchronous with the user and to ensure that both parties (the network and the user) use the same codebook.

In another example embodiment, the user selects a codebook in either DL/UL directions from the set of codebooks and informs the network through high layer signaling. The three cases mentioned above are also applicable in this example embodiment. There is a collision possibility in this example embodiment where the network and user select different codebooks, which may be dealt with through the use of a collision resolution algorithm. Alternatively, the receiver may deal with the situation where different codebooks are selected.

In another example embodiment, the network selects codebooks for the users but does not inform the users which codebooks are used. The users use blind detection to determine layers and codebooks and find if any of those layers is (are) assigned to it.

In another example embodiment, the user randomly selects one of the codebooks and the network blindly detects which codebooks are being used.

In another example embodiment, a method for grant based codebook assignment may be used. The grant in either UL/DL, may be on a physical control channel, carries information for the assigned codebook, which is determined dynamically by the network.

In another example embodiment, a method for grant based pseudo random codebook assignment may be used. The grant includes a seed or method for the UE to use to determine its assigned codebook in different time/frequency resources.

In another example embodiment, a method for UE ID codebook assignment is disclosed. The user may use its UE ID directly or combined with cell ID, and/or network ID, and/or time stamp, etc to find which codebook is assigned to it. Such a method is also known by the network and an agreed set of codebooks is used by both sides.

Although the present disclosure and its advantages have been described in detail, it should be understood that various changes, substitutions and alterations can be made herein without departing from the spirit and scope of the disclosure as defined by the appended claims.

What is claimed is:

1. A method for data transmission by a device in a communication system, the method comprising:
    modulating, by the device, a first stream of bits using a codebook to produce a second stream of symbols,
    wherein the codebook is in correspondence with a multi-dimensional modulation map that includes K complex dimensions, K being an integer value and greater than 1,
    wherein each complex dimension of the K complex dimensions includes a plurality of constellation points and a plurality of distinct projection points,
    wherein the each complex dimension corresponds to a different tone,
    wherein the multi-dimensional modulation map maps the plurality of constellation points to the plurality of distinct projection points, a number of the plurality of distinct projection points corresponding to a modulation scheme being smaller than a number of the plurality of constellation points of the each complex dimension of the multi-dimensional modulation map, and
    wherein the K complex dimensions comprise a first complex dimension with at least a first constellation point and a second constellation point of the multi-dimensional modulation map sharing a projection point, the first complex dimension corresponding to a first tone; and
    transmitting, by the device, the second stream of symbols over allocated resources in the communication system.

2. The method of claim 1, further comprising retrieving the multi-dimensional modulation map; and deriving the codebook from the multi-dimensional modulation map.

3. The method of claim 1, wherein the codebook comprises a sparse code multiple access (SCMA) codebook.

4. The method of claim 1, wherein the multi-dimensional modulation map is constructed as a union of K sub-maps with asymmetric components as the plurality of constellation points.

5. The method of claim 1, wherein the multi-dimensional modulation map is constructed as a union of K sub-maps on the K complex dimensions.

6. The method of claim 5, wherein each sub-constellation has a phase shift keying (PSK) constellation on one complex dimension and zero components on remaining complex dimensions.

7. The method of claim 6, wherein the PSK constellations comprise asymmetric PSK constellations.

8. A method for data receiving by a device in a communication system, the method comprising:
    receiving, by the device, a first stream of symbols over allocated resources in the communication system; and
    demodulating, by the device, the first stream of symbols using a codebook to produce a second stream of bits,
    wherein the codebook is in correspondence with a multi-dimensional modulation map that includes K complex dimensions, K being an integer value and greater than 1,
    wherein each complex dimension of the K complex dimensions includes a plurality of constellation points and a plurality of distinct projection points,
    wherein the each complex dimension corresponds to a different tone,
    wherein the multi-dimensional modulation map maps the plurality of constellation points to the plurality of distinct projection points, a number of the plurality of distinct projection points corresponding to a modulation scheme being smaller than a number of the plurality of constellation points of the each complex dimension of the multi-dimensional modulation map, and
    wherein the K complex dimensions comprise a first complex dimension with at least a first constellation point and a second constellation point of the multi-dimensional modulation map sharing a projection point, the first complex dimension corresponding to a first tone.

9. The method of claim 8, further comprising retrieving the multi-dimensional modulation map; and
    deriving the codebook from the multi-dimensional modulation map.

10. The method of claim 8, wherein the codebook comprises a sparse code multiple access (SCMA) codebook.

11. A device for data transmission in a communication system, the device comprising:
    a processor; and
    a non-transitory computer readable storage medium storing programming for execution by the processor, the programming including instructions to configure the device to:
        modulate a first stream of bits using a codebook to produce a second stream of symbols,
        wherein the codebook is in correspondence with a multi-dimensional modulation map that includes K complex dimensions, K being an integer value and greater than 1,
        wherein each complex dimension of the K complex dimensions includes a plurality of constellation points and a plurality of distinct projection points, wherein the each complex dimension corresponds to a different tone, wherein the multi-dimensional modulation map maps the plurality of constellation points to the plurality of distinct projection points, a number of the plurality of distinct projection points corresponding to a modulation scheme being smaller than a number of the plurality of constellation points of the each complex dimension of the multi-dimensional modulation map, and wherein the K complex dimensions comprise a first complex dimension with at least a first constellation point and a second constellation point of the multi-dimensional modulation map sharing a projection point, the first complex dimension corresponding to a first tone, and transmit the second stream of symbols over allocated resources in the communication system.

12. The device for claim 11, wherein the programming further includes instructions to: retrieve the multi-dimensional modulation map; and derive the codebook from the multi-dimensional modulation map.

13. The device for claim 2, wherein the codebook comprises a sparse code multiple access (SCMA) codebook.

14. The device of claim 11, wherein the multi-dimensional modulation map is constructed as a union of K sub-maps with asymmetric components as the plurality of constellation points.

15. The device of claim 11, wherein the multi-dimensional modulation map is constructed as a union of K sub-maps on the K complex dimensions.

16. The device of claim 15, wherein each sub-constellation has a phase shift keying (PSK) constellation on one complex dimension and zero components on remaining complex dimensions.

17. The device of claim 16, wherein the PSK constellations comprise asymmetric PSK constellations.

18. A device for data receiving in a communication system, the device comprising:
a processor; and
a non-transitory computer readable storage medium storing programming for execution by the processor, the programming including instructions to configure the device to:
receive a first stream of symbols over allocated resources in the communication system, and
demodulate the first stream of symbols using a codebook to produce a second stream of bits, wherein the codebook is in correspondence with a multi-dimensional modulation map that includes K complex dimensions, K being an integer value and greater than 1, wherein each complex dimension of the K complex dimensions includes a plurality of constellation points and a plurality of distinct projection points, wherein the each complex dimension corresponds to a different tone, wherein the multi-dimensional modulation map maps the plurality of constellation points to the plurality of distinct projection points, a number of the plurality of distinct projection points corresponding to a modulation scheme being smaller than a number of the plurality of constellation points of the each complex dimension of the multi-dimensional modulation map, and wherein the K complex dimensions comprise a first complex dimension with at least a first constellation point and a second constellation point of the multi-dimensional modulation map sharing a projection point, the first complex dimension corresponding to a first tone.

19. The device of claim 18, wherein the programming further includes instructions to retrieve the multi-dimensional modulation map; and
derive the codebook from the multi-dimensional modulation map.

20. The device of claim 18, wherein the codebook comprises a sparse code multiple access (SCMA) codebook.

21. The method of claim 1, wherein each of the distinct projection points corresponds to a complex symbol transmitted over a corresponding tone.

22. The method of claim 1, wherein the number of the plurality of constellation points of the each complex dimension is $(a2^n)/d$, the number of the plurality of distinct projection points of the each complex dimension is at most $a^2$, wherein n denotes a number of complex dimensions of the K complex dimensions, and a and d are integer values.

23. The method of claim 1, wherein the K complex dimensions further comprise a second complex dimension corresponding to a second tone, the second complex dimension including the first constellation point and the second constellation point mapped to different projection points in the second complex dimension.

* * * * *